United States Patent
Mikhael et al.

(10) Patent No.: US 11,764,792 B2
(45) Date of Patent: Sep. 19, 2023

(54) PHASE LOCKED LOOP CIRCUITRY

(71) Applicant: Socionext Inc., Kanagawa (JP)

(72) Inventors: David Hany Gaied Mikhael, Langen (DE); Bernd Hans Germann, Langen (DE); Ricardo Doldan Lorenzo, Langen (DE)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/837,516

(22) Filed: Jun. 10, 2022

(65) Prior Publication Data

US 2022/0407525 A1 Dec. 22, 2022

(30) Foreign Application Priority Data

Jun. 18, 2021 (EP) .................................. 21180429

(51) Int. Cl.
*H03L 7/099* (2006.01)
*H03L 7/089* (2006.01)

(52) U.S. Cl.
CPC ............ *H03L 7/099* (2013.01); *H03L 7/0891* (2013.01); *H03L 2207/06* (2013.01)

(58) Field of Classification Search
CPC ..... H03L 7/00; H03L 7/06; H03L 7/08; H03L 7/085; H03L 7/089; H03L 7/0891; H03L 7/093
See application file for complete search history.

(56) References Cited

U.S. PATENT DOCUMENTS

| | | |
|---|---|---|
| 6,864,753 B2 | 3/2005 | Lee et al. |
| 7,310,021 B2 | 12/2007 | Familia |
| 7,619,452 B2 | 11/2009 | Lee et al. |
| 8,120,431 B2 | 2/2012 | Liu |
| 10,067,478 B1 | 9/2018 | Kolar Ranganathan |
| 2009/0256601 A1* | 10/2009 | Zhang ..................... H03L 7/085 341/111 |

FOREIGN PATENT DOCUMENTS

WO 2008/055754 A1 5/2008

OTHER PUBLICATIONS

Extended European Search Report dated Nov. 30, 2021 issued in the corresponding European Patent Application No. 21180429.9.

* cited by examiner

*Primary Examiner* — Diana J. Cheng
(74) *Attorney, Agent, or Firm* — McDermott Will & Emery LLP (57) ABSTRACT

Phase Locked Loop, PLL, circuitry comprising a phase detector configured to generate a first pulse signal comprising at least one first pulse, a property of each first pulse being indicative of a phase difference between a reference signal and a feedback signal; a pulse repeater circuit configured, based on the first pulse signal, to generate a second pulse signal comprising, for each first pulse, a second pulse generated by repeating the corresponding first pulse; and an oscillator configured to generate the feedback signal and control a frequency of the feedback signal based on the second pulse signal.

12 Claims, 9 Drawing Sheets

PHASE LOCKED LOOP CIRCUITRY

CROSS-REFERENCE OF RELATED APPLICATIONS

This application claims the benefit of European Patent Application No. 21180429.9, filed on Jun. 18, 2021, the entire disclosure of which Application is incorporated by reference herein.

The present invention relates to phase locked loop, PLL, circuitry, for example for generating an output signal with a frequency that matches a frequency of an input signal. The present invention also relates to phase detectors for use in such PLL circuitry.

By way of background, conventional PLL circuitry comprises a phase detector configured to detect a phase difference between two input signals (e.g. a reference signal and a feedback signal). An output signal is generated by the phase detector to indicate the phase difference between the two input signals. The phase detector output signal is used to control a PLL output signal generated by an oscillator, such as a voltage-controlled oscillator, VCO.

Figure 1:
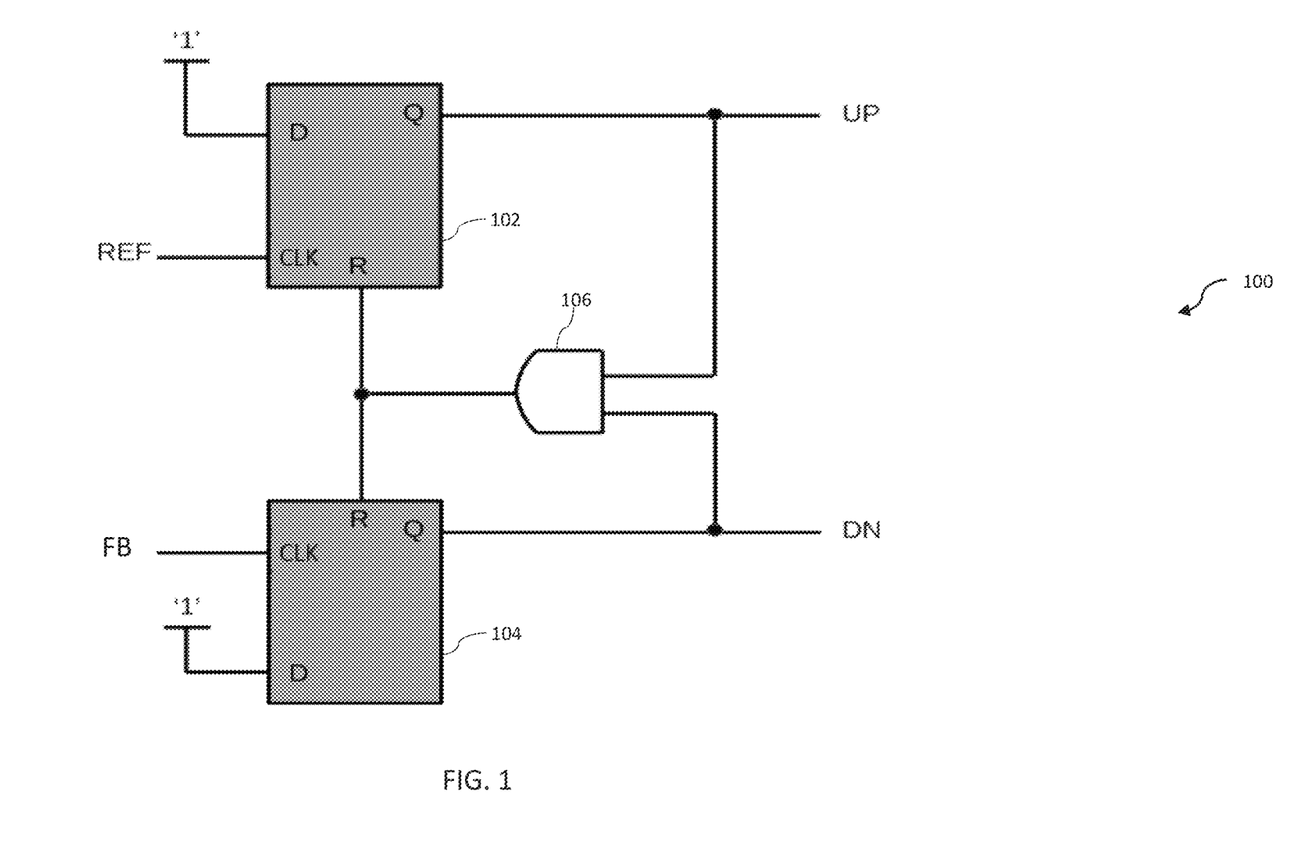
FIG. 1, considered above, is a schematic diagram of a phase detector.

A schematic diagram of a previously considered phase detector 100 will now be considered with reference to FIG. 1. The phase detector 100 is a tristate (three-state) phase detector comprising first and second D-type flip flop circuits 102, 104 and an AND gate 106. The first D-type flip flop circuit 102 generates an UP signal at a first output terminal Q based on a reference signal REF. In a similar manner, the second D-type flip flop circuit 104 generates a DN signal at a second output terminal Q based on a feedback signal FB. The UP and DN signals are fed back to the reset terminals R of the D-type flip flop circuits 102, 104 via the AND gate 106. That is, the inputs to the AND gate 106 are taken from the first and second output terminals. For both D-type flip flop circuits 102, 104, the data input D is fixed to a high value, as illustrated by "1" in FIG. 1.

In a case where the reference signal REF is leading the feedback signal FB (e.g. a rising edge of the reference signal REF is detected before a rising edge of the feedback signal FB), the phase detector 100 generates the UP signal with a signal duration that is proportional to a duration of the phase difference, as explained in more detail below. In a case where the reference signal REF is lagging the feedback signal FB (e.g. a rising edge of the feedback signal FB is detected before a rising edge of the reference signal REF), the phase detector 100 generates the DN signal with a signal duration that is proportional to a duration of the phase difference.

Figure 2:
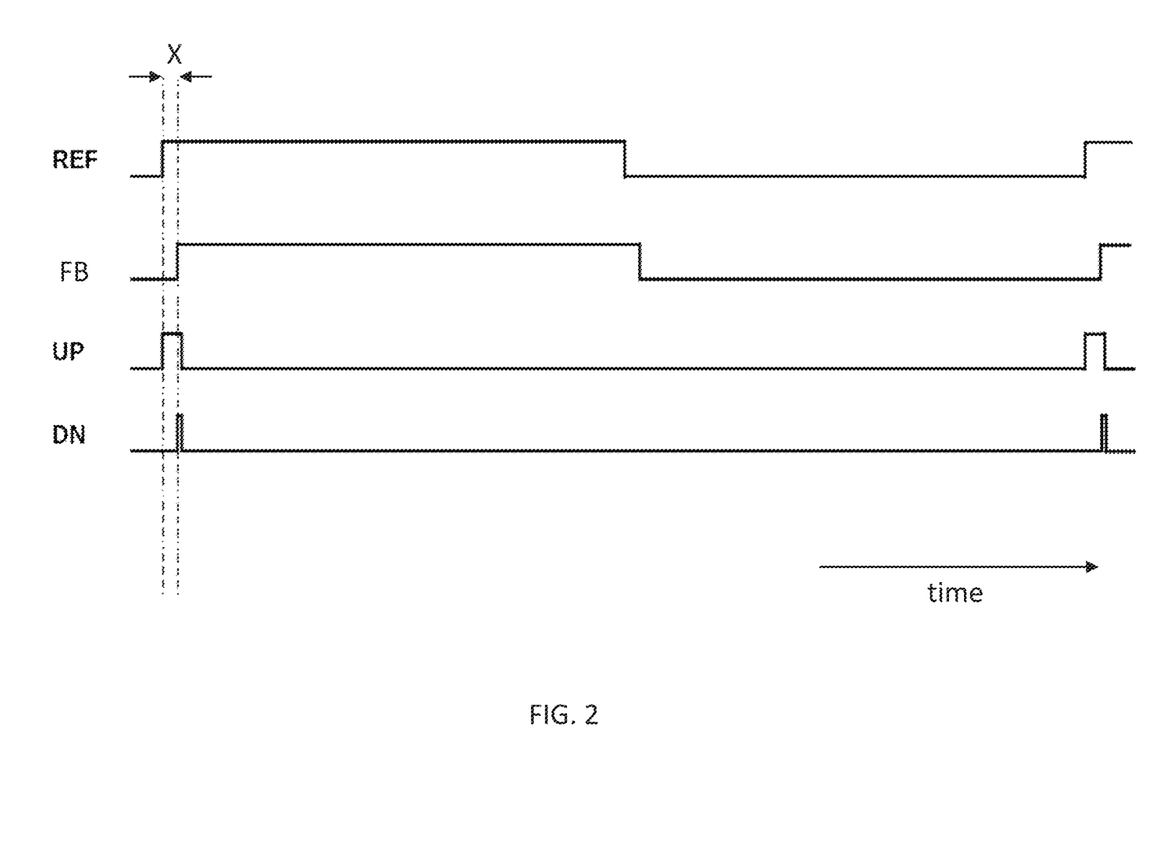
FIG. 2 is a graphical representation of the UP and DN signals generated by the phase detector of FIG. 1 based on a phase difference X between a reference signal and a feedback signal.

FIG. 2 is a graphical representation of the UP and DN signals generated by the phase detector 100 based on a phase difference X between the reference signal REF and the feedback signal FB when the reference signal REF is leading the feedback signal FB. Each signal trace shown could be taken to show voltage level (or logic level) over time.

As illustrated in FIG. 2, a rising edge of the UP signal is generated when a rising edge of the reference signal REF is detected. When a rising edge of the feedback signal FB is detected, a rising edge of the DN signal is generated. The inputs of the AND gate both become high at the same time when the reference signal REF and the feedback signal FB are high (e.g. 5V), which causes the AND gate to output a high signal to the reset terminals, thereby resetting both of the D-type flip flop circuits 102, 103.

A pulse of the UP signal has a duration proportional to the phase difference between the reference signal REF and the feedback signal FB plus a reset period during which the reference signal REF and the feedback signal FB are both high. A pulse of the DN signal has a duration defined by the reset period only.

Of course, if the reference signal REF were instead to lag the feedback signal FB by the phase difference X, the UP pulse would look like the DN pulse and vice versa.

A gain of the phase detector 100, looking at average voltage over time, in a case where the reference signal REF is leading the feedback signal FB, can therefore be defined as follows:

$$Gain_{Phase\_Detector} = \frac{\Delta\Phi * VDD}{2\pi}(V/\text{rad}),$$

where $\Delta\Phi$ is a pulse width of the UP signal pulse in radians, VDD is the output voltage of the first output terminal and $2\pi$ is a reference signal period in radians.

It will be appreciated that the gain of the phase detector 100 is limited by circuit topology and signal frequencies. These limitations to gain may cause deterioration in overall noise performance of the PLL circuitry as well as making the PLL circuitry more sensitive to analog non-idealities, such as mismatch of succeeding stages of the PLL.

It is desirable to solve some or all of the above-mentioned problems.

According to an embodiment of a first aspect of the present invention, there is provided Phase Locked Loop, PLL, circuitry comprising: a phase detector configured to generate a first pulse signal comprising at least one first pulse, a property of each first pulse being indicative of a phase difference between a reference signal and a feedback signal; a pulse repeater circuit configured, based on the first pulse signal, to generate a second pulse signal comprising, for each first pulse, a second pulse generated by repeating the corresponding first pulse; and an oscillator configured to generate the feedback signal and control a frequency of the feedback signal based on (at least) the second pulse signal.

Thus, the introduction of pulse repeater circuitry to generate a second pulse provides a means to control or simply increase the gain of a phase detector output signal. For example, the number of pulses in the combination of the first and second pulse signals, or in the second pulse signal, may be larger than in the first pulse signal. As another example, the number of pulses in the second pulse signal may be controlled by the pulse repeater circuitry in order to vary the gain of the phase detector output signal. Advantageously, an increase in phase detector output signal gain provides improved noise performance and higher sensitivity. Furthermore, decreasing the phase detector output signal provides the advantage of increased phase error range (i.e. a larger phase error can be detected before saturation).

The pulse repeater circuit may be configured to generate a plurality of second pulses, each second pulse corresponding to a different first pulse.

The second pulse signal (or a combination of the first and second pulse signals) may be an oscillator control signal for controlling the frequency of the feedback signal generated by the oscillator.

The oscillator may be a voltage controlled oscillator (VCO). The oscillator may comprise a low pass frequency filter (LPF) configured to filter at least the second pulse signal.

The pulse repeater circuit may be configured, for each first pulse, to generate the second pulse by passing the corresponding first pulse via one or more delay elements.

The one or more delay elements may control a duration of time between the first pulse and the second pulse. The duration of time between the first pulse and the second pulse may be varied by varying the configuration of the one or more delay elements.

The pulse repeater circuit may be configured such that, for each first pulse, the second pulse signal comprises a succession of second pulses, each successive second pulse of that succession of second pulses generated by repeating the corresponding first pulse or by repeating the or a preceding second pulse of that succession of second pulses.

The pulse repeater circuit may be configured to generate a plurality of successions of second pulses, each succession of second pulses corresponding to a different first pulse.

The pulse repeater circuit may be configured, for each first pulse, to generate each successive second pulse of the succession of second pulses by passing the corresponding first pulse via one or more delay elements or by passing the or a preceding second pulse of that succession of second pulses via one or more delay elements.

For each first pulse, the succession of second pulses may be a series of repeated first pulses each separated by a duration of time controlled by the one or more delay elements. For example, each successive second pulse may be a repetition of the corresponding first pulse delayed by a respective delay relative to that first pulse which is determined by a respective one or more delay elements.

For each first pulse, the succession of second pulses may be generated by repeating a preceding second pulse (e.g. the adjacent preceding second pulse or any preceding second pulse), and each of the second pulses in the succession may be separated by a duration of time controlled by the one or more delay elements.

For each first pulse, the second pulse or the succession of second pulses may be generated by performing said repeating until a corresponding defined period of time elapses.

Advantageously, repeating the succession of second pulses until the corresponding defined period of time has elapsed provides a means for avoiding a race condition between clock cycles (i.e. between cycles of the reference signal REF).

Each defined period of time may be defined by the reference signal and/or the corresponding first pulse. Repeating the succession of second pulses may continue until the reference signal is set to low (i.e. 0V or close to 0V) and/or the corresponding first pulse has ended. Each defined period of time may commence with the start or end of the corresponding first pulse.

The pulse repeater circuit may be configured, for each first pulse, to include that first pulse in the second pulse signal. The second pulse signal may comprise the second pulse and the corresponding first pulse. The second pulse signal may comprise the succession of second pulses and the corresponding first pulse.

The pulse repeater circuit may be configured to control a delay between each second pulse and the preceding pulse it repeats. The delay may be the duration of time controlled by the one or more delay elements. The delay may be increased and/or decreased by varying the configuration of the one or more delay elements. The delay may be between the second pulse and the corresponding first pulse and/or the delay may be between each second pulse in the succession of second pulses.

The pulse repeater circuit may comprise one or more delay elements, optionally connected together to form a loop, a node along that loop being an output node at which the second pulse signal is generated. Optionally, said delay may be defined by said one or more delay elements. The configuration of the one or more delay elements may define the delay.

The second pulse may be generated by feeding the corresponding first pulse through the loop via the one or more delay elements. Each successive second pulse in the succession of second pulses may be generated by feeding the or a preceding second pulse through the loop via the one or more delay elements.

As another option, the pulse repeater may comprise a plurality of delay paths each comprising one or more delay elements. Each of the plurality of delay paths may comprise a different configuration of one or more delay elements such that a different delay may be generated by each delay path. Output terminals of each delay path may be connected together at the output node. The succession of second pulses may be generated by passing the corresponding first pulse through each of the plurality of delay paths.

The pulse repeater circuit may be configured, based on a control signal, to control said delay by controlling a configuration of the pulse repeater circuit; and controlling the configuration of the pulse repeater circuit may comprise controlling one or more of: the number of delay elements connected to generate each second pulse, or the number of delay elements connected into the loop; which delay elements are connected to generate each second pulse, or which delay elements are connected into the loop; and a configuration of at least one delay element which is connected to generate each second pulse, or a configuration of at least one delay element which is connected into the loop.

The number of delay elements may be increased or decreased in order to vary the gain of the phase detector output signal. Which delay element may be taken to mean the type of delay element connected to generate each second pulse (e.g. a pair of inverters, an OR logic gate, an AND logic gate). A configuration of at least one delay element may be taken to mean a configuration of a variable delay element which is configured to provide a range of delays.

Controlling the configuration of the pulse repeater circuit may be taken to mean controlling the configuration of the one or more delay elements. The pulse repeater circuit may comprise control circuitry configured, based on the control signal, to control the configuration of the pulse repeater circuit. The control circuitry may be part of the pulse repeater circuitry. Alternatively, the control circuitry may be external circuitry.

The control circuitry may generate the control signal to control the configuration of the one or more delay elements. The PLL circuitry may comprise control-signal generation circuitry configured to generate said control signal in dependence upon one or more of: said reference signal; and another control signal received from external circuitry.

At least one said delay element connected into the loop may be a logic gate having a first input forming part of the loop and a second input connected to receive the first pulse signal. The logic gate having a first input forming part of the loop and a second input connected to receive the first pulse signal may be an OR gate.

At least one said delay element connected into the loop may be a logic gate having a first input forming part of the loop and a second input connected to receive a reset signal; and that logic gate is configured, for each first pulse, to terminate generation of the at least one repeated pulse in dependence upon the reset signal, optionally wherein the reset signal is, or is dependent upon, the reference signal.

The logic gate having a first input forming part of the loop and a second input connected to receive a reset signal may be an AND gate.

The reset signal may be a logic signal and the logic gate may terminate generation of the at least one repeated pulse when the logic signal switches to a low logic (e.g. 0V or close to 0V).

The phase detector may be configured to generate a pair of said first pulse signals; the PLL circuitry comprises a pair of said pulse repeater circuits corresponding respectively to said first pulse signals and each configured to generate a said second pulse signal corresponding to its respective first pulse signal; and the oscillator is configured to control the frequency of the feedback signal based on the second pulse signals.

The second pulse signals may be summed to generate the oscillator control signal for controlling the oscillator.

According to an embodiment of a second aspect of the present invention, there is provided integrated circuitry such as an IC chip comprising the PLL circuitry of the aforementioned first aspect.

According to an embodiment of a third aspect of the present invention, there is provided Phase Locked Loop, PLL, circuitry comprising: a phase detector configured to generate a first pulse signal comprising at least one first pulse, a property of each first pulse being indicative of a phase difference between a reference signal and a feedback signal; a pulse repeater circuit configured, based on the first pulse signal, to generate a second pulse signal comprising, for each first pulse, a second pulse generated by passing the corresponding first pulse via one or more delay elements; and an oscillator configured to generate the feedback signal and control a frequency of the feedback signal based on the second pulse signal.

The pulse repeater circuit according to the third aspect may be configured such that, for each first pulse, the second pulse signal comprises a succession of second pulses, each successive second pulse of that succession of second pulses generated by passing the corresponding first pulse via one or more delay elements or by passing the or a preceding second pulse of that succession of second pulses via one or more delay elements.

For each first pulse according to the third aspect, the second pulse or the succession of second pulses may be generated until a corresponding defined period of time elapses.

Each defined period of time according to the third aspect may be defined by the reference signal and/or the corresponding first pulse.

The pulse repeater circuit according to the third aspect may be configured, for each first pulse, to include that first pulse in the second pulse signal.

According to an embodiment of a fourth aspect of the present invention, there is provided a phase detector configured to generate a first pulse signal comprising at least one first pulse, a property of each first pulse being indicative of a phase difference between a pair of input signals, the phase detector comprising: a pulse repeater circuit configured, based on the first pulse signal, to generate a second pulse signal comprising, for each first pulse, a second pulse generated by repeating the corresponding first pulse.

According to an embodiment of a fifth aspect of the present invention, there is provided a phase detector configured to generate a first pulse signal comprising at least one first pulse, a property of each first pulse being indicative of a phase difference between a pair of input signals, the phase detector comprising: a pulse repeater circuit configured, based on the first pulse signal, to generate a second pulse signal comprising, for each first pulse, a second pulse generated by passing the corresponding first pulse via one or more delay elements.

According to an embodiment of a sixth aspect of the present invention, there is provided PLL, circuitry, clock retimer circuitry or clock-edge-aligner circuitry comprising the phase detector of aspect four or aspect five.

According to embodiments of a seventh aspect of the present invention, there is provided integrated circuitry such as an IC chip comprising the phase detector of the aforementioned fourth aspect or fifth aspect.

Reference will now be made, by way of example, to the accompanying drawings, of which.

Figure 3:
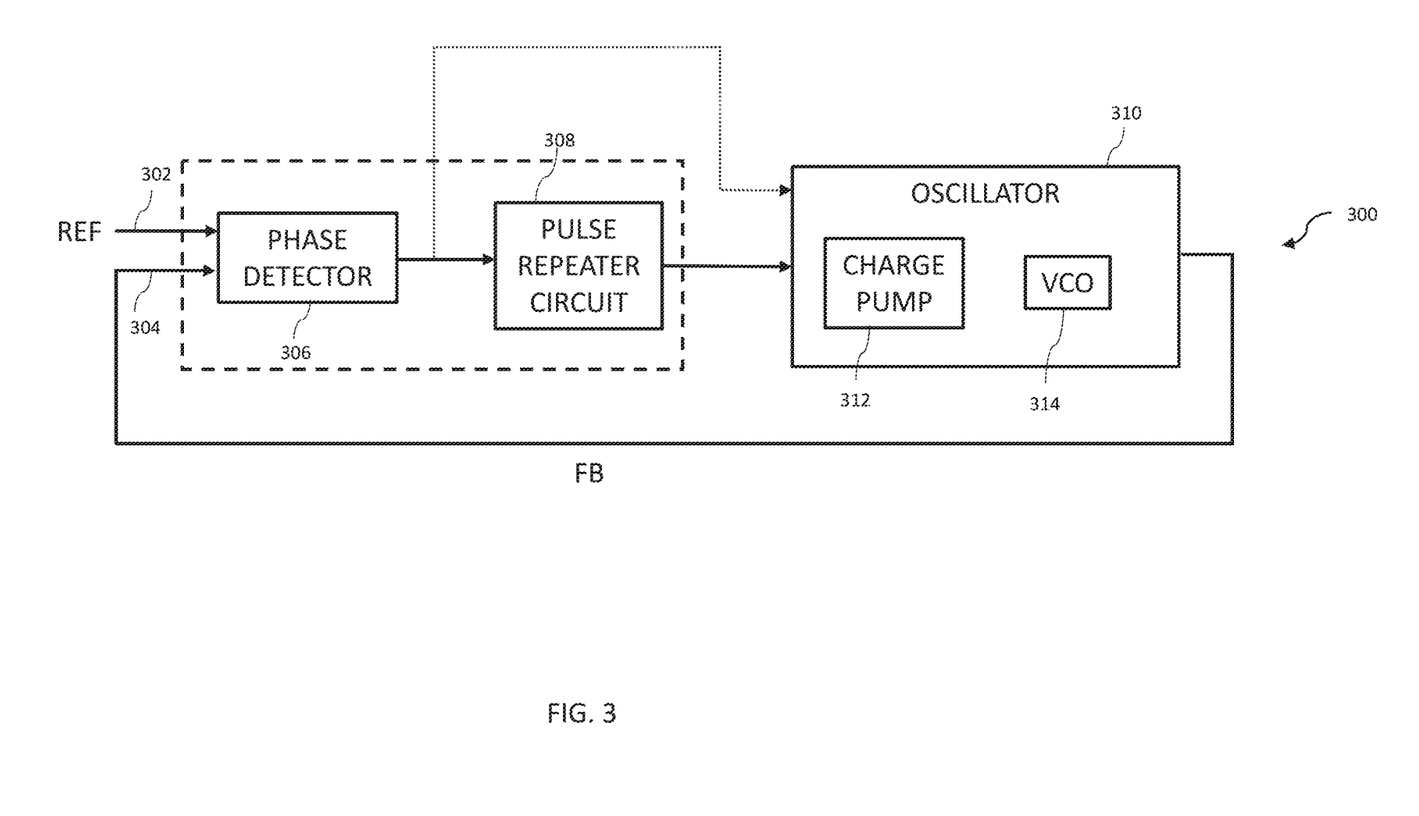
FIG. 3 is a schematic diagram of PLL circuitry embodying the present invention.

FIG. 3 is a schematic diagram of PLL circuitry 300 embodying the present invention. The PLL circuitry 300 comprises a phase detector 306, a pulse repeater circuit 308, and an oscillator 310.

The phase detector 306 is configured to detect a phase difference between a reference signal REF, received at a first input terminal 302, and a feedback signal FB, received at a second input terminal 304. A first pulse signal comprising at least one first pulse is generated by the phase detector 306 such that a property of the first pulse (such as its pulse width) is indicative of the phase difference. That is, the at least one first pulse is generated to be proportional to the phase difference between the reference signal and the feedback signal.

It will be appreciated that the phase detector 306 in not limited to a tristate phase detector 100, as described with reference to FIG. 1. The phase detector 306 may be any type of phase detector, for example another digital phase detector such as an XOR phase detector which is configured to lock at 0° phase difference.

The PLL circuitry 300 differs from conventional PLL circuitry at least in that the pulse repeater circuit 308 is connected to an output of the phase detector 306 (e.g. a phase detector output terminal is connected to a pulse repeater input terminal). The pulse repeater circuit 308 is configured to generate a second pulse signal based on the first pulse signal generated by the phase detector 306.

The phase detector 306 and the pulse repeater circuit 308 may be combined as a phase detector circuit having the functionality of the phase detector 306 and the pulse repeater circuit 308 in combination, as indicated by the dashed line box in FIG. 3.

In certain embodiments where the first pulse signal comprises a single first pulse, the second pulse signal comprises a second pulse generated by repeating the first pulse. By repeating the first pulse, a property of the generated second pulse (such as its pulse width) may be proportional to the phase difference indicated by the corresponding first pulse. The pulse repeater circuit 308 may be configured, for the first pulse, to generate the second pulse by passing the corresponding first pulse via one or more delay elements. An example use of delay elements will be considered later in connection with FIGS. 5 and 6.

The second pulse signal may be generated to include the first pulse and the second pulse.

In certain embodiments where the first pulse signal comprises a plurality of first pulses, the second pulse signal comprises a plurality of second pulses each generated by repeating a corresponding first pulse from among the plurality of first pulses. The second pulse signal may be generated to include the plurality of first pulses and the plurality of second pulses. Corresponding first and second pulses may be generated to be adjacent to each other in time.

The pulse repeater circuit 308 may be further configured to generate the second pulse signal to comprise a succession of second pulses per corresponding first pulse. Each successive second pulse of that succession of second pulses may be generated by repeating the corresponding first pulse or by repeating the or a preceding second pulse of that succession of second pulses. The pulse repeater circuit 308 may be configured, for each first pulse, to generate each successive second pulse of the succession of second pulses by passing the corresponding first pulse via one or more delay elements or by passing the or a preceding second pulse of that succession of second pulses via one or more delay elements.

Merely as an example, in a succession of pulses, each successive pulse may be generated by passing any of the preceding pulses through one or more delay elements. For example, a given first pulse may be passed through parallel paths having differing numbers of unit delay elements, with the signals at the end of those paths combined to generate the second pulse signal.

In a similar manner to as described above, in certain arrangements where the first pulse signal comprises a single first pulse, the second pulse signal comprises a succession of second pulses generated by repeating the first pulse as an initial pulse of the succession and repeating a preceding second pulse of that succession for all subsequent second pulses. The second pulse signal may be generated to include the first pulse and the succession of second pulses.

In certain arrangements where the first pulse signal comprises a plurality of first pulses, the second pulse signal comprises a plurality of succession of second pulses generated by repeating the corresponding first pulse from among the plurality of first pulses and repeating the preceding second pulse of that succession of second pulses. The second pulse signal may be generated to include the plurality of first pulses and the plurality of successions of second pulses. Corresponding first pulses and successions of second pulses may be generated to be adjacent to each other in time.

For each first pulse, the succession of second pulses may continue in the second pulse signal until a corresponding defined period of time elapses. The defined period of time may be defined by the reference signal. For example, the first pulse signal may comprise three first pulses, defined as pulse A, pulse B, and pulse C, each of which indicate a different phase difference (e.g. pulse A indicates a phase difference between reference signal A and feedback signal A). In such an example, the second pulse signal may be generated to comprise three different successions of second pulses, defined as succession A, secession B, and secession C, corresponding to pulse A, pulse B, and pulse C, respectively. The repeating of preceding second pulses may continue in each succession until the corresponding reference signal (e.g. reference signal A for succession A) is reset to a predetermined low value (e.g. 0V or a value close to 0V). For each first pulse, the defined period of time may commence with that first pulse.

Figure 4:
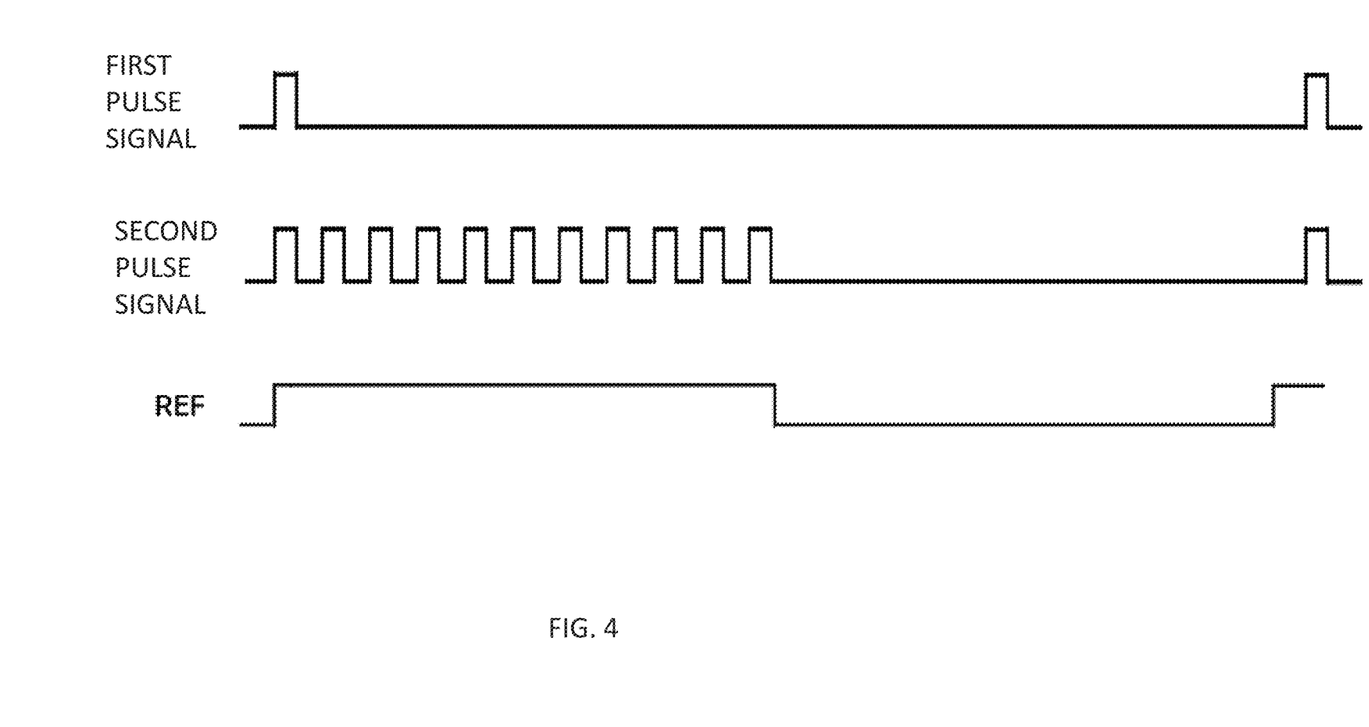
FIG. 4 is a graphical representation of signals generated by a pulse repeater circuit.

FIG. 4 is a graphical representation of signals generated by the pulse repeater circuit 308, in a given arrangement where the pulse repeater circuit 308 is configured to generate the second pulse signal to comprise a succession of second pulses per corresponding first pulse as mentioned above. In particular, FIG. 4 illustrates how the reference signal REF may define the defined period of time during which the succession of second pulses may be repeated in the second pulse signal. According to embodiments illustrated by FIG. 4, the first pulse signal comprises a single first pulse and the second pulse signal comprises a succession of second pulses which are based on the first pulse and are repeated until the reference signal REF is reset to the predetermined low value (i.e. until the defined period of time elapses). In certain embodiments, the reference signal REF may be reset in the middle of a second pulse thereby resulting in the second pulse signal comprising a fractional second pulse (in comparison to a preceding second pulse or the corresponding first pulse).

The pulse repeater circuit 308 may be configured to control a delay between each second pulse and the preceding pulse it repeats. The preceding pulse may be the first pulse in certain embodiments where the second pulse signal comprises the first pulse. The preceding pulse may also be a preceding second pulse of a succession of second pulses in certain embodiments where the second pulse signal comprises a succession of second pulses. Where the second pulse signal comprises a first pulse and a succession of second pulses, the preceding pulse to the initial second pulse of the succession may be the first pulse (which may be considered a second pulse itself), and a preceding pulse to subsequent second pulses of the succession may be the preceding second pulse of that succession.

Figure 5:
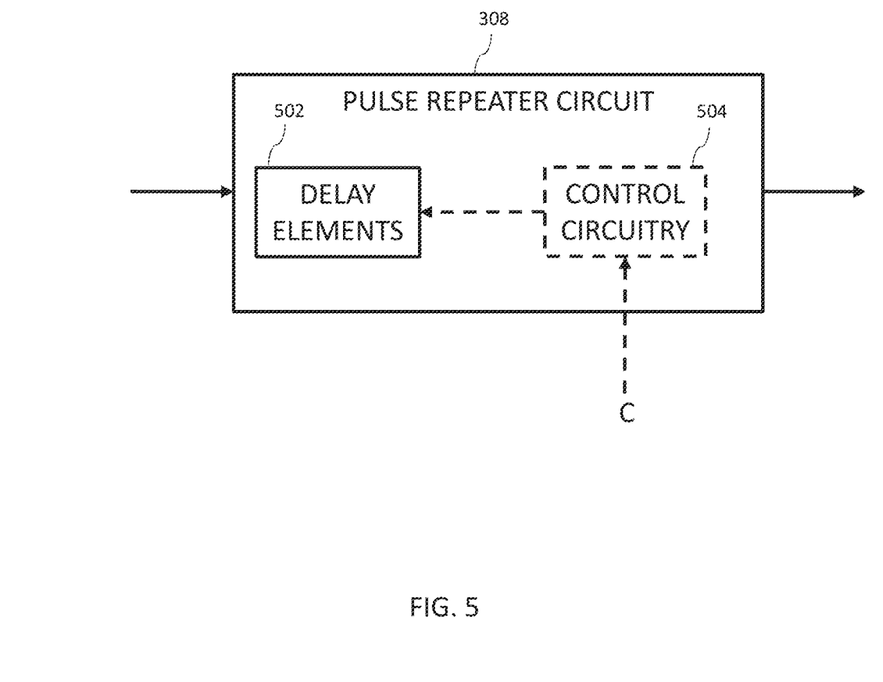
FIG. 5 is a schematic diagram of the pulse repeater circuit from the PLL circuitry of FIG. 3.

The delay between each successive second pulse and the preceding pulse it repeats may be controlled using delay elements 502 which are optionally controlled by control circuitry 504, as illustrated in FIG. 5.

FIG. 5 is a schematic diagram of the pulse repeater circuit 308 comprising the one or more delay elements 502 and the optional control circuitry 504. As discussed in more detail below, the delay between each second pulse and the preceding pulse it repeats may be controlled using the control circuitry 504 to varying the number of delay elements 502 employed, which type of delay elements 502 are employed (e.g. selected or connected for use) and/or a configuration of at least one of the delay elements 502.

The pulse repeater circuit 308 may comprise one or more delay elements 502 connected together to form a loop, a node along that loop being an output node at which the second pulse signal is generated. The output node may be located at any position along the loop. An example of such a loop configuration will be described later in connection with FIG. 6.

The delay between each second pulse and the preceding pulse it repeats may be defined by the one or more delay elements 502 in the loop. At least one delay element 502 connected into the loop may be a logic gate (a first logic gate) having a first input forming part of the loop and a second input connected to receive the first pulse signal.

Further, at least one delay element 502 connected into the loop may be a logic gate (a second logic gate) having a first input forming part of the loop and a second input connected to receive a reset signal. The second logic gate may be further configured to terminate generation of the at least one repeated pulse in dependence upon the reset signal.

For example, in certain arrangements where the first pulse signal comprises a single first pulse, the second logic gate may terminate generation of the second pulse or the succession of second pulses in response to the reset signal being set to a predetermined low value (e.g. 0V or a value close to 0V). In certain embodiments where the first pulse signal comprises a plurality of single pulses, the second logic gate may terminate generation of each corresponding second pulse or succession of second pulses in response to the reset signal being set to a predetermined low value (e.g. 0V or a value close to 0V). The reset signal may be set to a predetermined high value (e.g. 5V or a value close to 5V) before another first pulse signal is generated.

The reset signal may be the reference signal which defines (at least the end of) the defined period of time, as discussed above in relation to FIG. 4. The reset signal may be dependent upon the reference signal such that the reset signal follows the characteristics of the reference signal.

The loop may comprise the first and/or the second logic gates.

It will be understood that the number of second pulses comprised in the second pulse signal per first pulse (which may be an integer or integer-plus-fraction number) may be controlled by the reset signal and the delay. The reset signal may control the period of time during which a succession of second pulses may continue in the second pulse signal. The delay may control the period of time that elapses between the (start of the) first pulse and the (start of the) second pulse and/or each second pulse among the succession of second pulses. Control over the delay will now be described in more detail in relation to the one or more delay elements 502 and the control circuitry 504.

A configuration of the pulse repeater circuit 308 may be controlled by an optional control signal C as shown in FIG. 5 in order to control the delay. In certain embodiments, the pulse repeater circuit 308 comprises the control circuitry 504 and the control circuitry 504 may be configured to control the configuration of the pulse repeater circuit 308 based on the control signal C, in order to control the delay, by controlling one or more of:

a) the number of delay elements 502 connected into the loop:
  the number of delay elements 502 connected into the loop may be increased or decreased. For example, the control signal C may control the control circuitry 504 to connect additional delay elements into the loop, up to a maximum number of delay elements, thereby increasing the delay. Further, the control signal may control the control circuitry 504 to disconnect delay elements from the loop, down to a minimum number of delay elements, thereby decreasing the delay. In this respect, the control circuitry 504 may be, or comprise, switching circuitry;
b) which delay elements 502 are connected into the loop:
  the loop may comprise a variety of different delay elements 502 each of which generate a different delay (e.g. logic gates such as AND gates, OR gates and inverters). Therefore, the control signal may control the control circuitry 504 to connect certain different delay elements 502 into the loop to generate a specific delay resulting from that combination of certain different delay elements 502. In this respect, the control circuitry 504 may be, or comprise, switching circuitry;
c) a configuration of at least one delay element which is connected into the loop.
  at least one of the delay elements may be a variable delay element and may be configurable to control the delay it provides. For example, at least one of the delay elements may be tuned based on the control signal C to increase or decrease the delay provided by that delay element. The at least one configurable delay element may be connected into the loop with additional delay elements (e.g. configurable or non-configurable delay elements).

The control circuitry 504 may comprise, for example, an array of switches and/or multiplexers connected between or to the one or more delay elements.

The PLL circuitry 300 may comprise control-signal generation circuitry (not shown) configured to generate the control signal C. Alternatively, the control-signal generation circuitry may be part of the pulse repeater circuit 308. The control-signal generation circuitry may be configured to generate the control signal to be dependent upon one or more of: the reference signal and another control signal received from external circuitry.

By controlling the reset signal and the delay, the pulse repeater circuit 308 controls the generation of second pulses in the second pulse signal. Advantageously, control over the generation of second pulses provides a means to control the gain of a phase detector output signal. That is, reducing the delay and/or increasing the defined period of time allows for more second pulses to be generated which has the effect of increasing the phase detector output signal gain. Furthermore, increasing the delay and/or decreasing the defined period of time allows for fewer second pulse signals to be generated which has the effect of reducing the phase detector output signal gain in order.

Increasing phase detector output signal gain provides the advantage of improved noise performance (due to a reduced charge pump noise contribution in the PLL, for example) and higher sensitivity, whereas decreasing phase detector output signal gain provides the advantage of increased phase error range. That is, by decreasing the phase detector output signal gain, a larger phase error can be detected before saturation occurs. Phase error range may be related to the delay. Advantageously, the phase repeater circuit 308 (having the control circuitry 504) provides a means for both increasing and decreasing gain as necessary by controlling the reset signal and the delay, as described above. The control signal C may thus be generated to control the phase detector output signal gain, and the desirable gain may be dependent on other circuitry within which, or with which, the PLL circuitry 300 operates. For example, the phase detector output signal gain may be varied in order to control the PLL loop-bandwidth and/or control the phase margin.

Looking back to FIG. 3, the oscillator 310 is configured to generate the feedback signal and control a frequency of the feedback signal based on the second pulse signal. As indicated with a dotted line, the oscillator 310 may additionally be configured to generate the feedback signal and control the frequency of the feedback signal based on the first pulse signal. The oscillator 310 may comprise a voltage-controlled oscillator, VCO, and charge pump circuitry 312. The charge pump circuitry 312 may comprise a low pass frequency filter configured to filter the second pulse signal (and optionally also the first pulse signal) to generate a control signal for controlling the VCO.

According to certain arrangements, the PLL circuitry 300 may comprise a pair of pulse repeater circuits (a first pulse repeater circuit and a second pulse repeater circuit) corresponding respectively to a pair of first pulse signals (first pulse signal A and first pulse signal B) generated by the phase detector 306. The pair of first pulse signals may differ according to whether the reference signal is leading or lagging the feedback signal. For example, pulse signal A may indicate the phase difference between the reference signal and the feedback signal when the reference signal is leading, and pulse signal B may indicate the phase difference between the reference signal and the feedback signal when the reference signal is lagging.

The pair of pulse repeater circuits may each be configured to generate a second pulse signal corresponding to its respective first pulse signal. For example, the first pulse repeater circuit may generate a second pulse signal A corresponding to first pulse signal A, and the second pulse repeater circuit may generate another second pulse signal B corresponding to first pulse signal B. The oscillator 310 may be further configured to control the frequency of the feedback signal based on both of the second pulse signals (and optionally also both of the first pulse signals).

Figure 6:
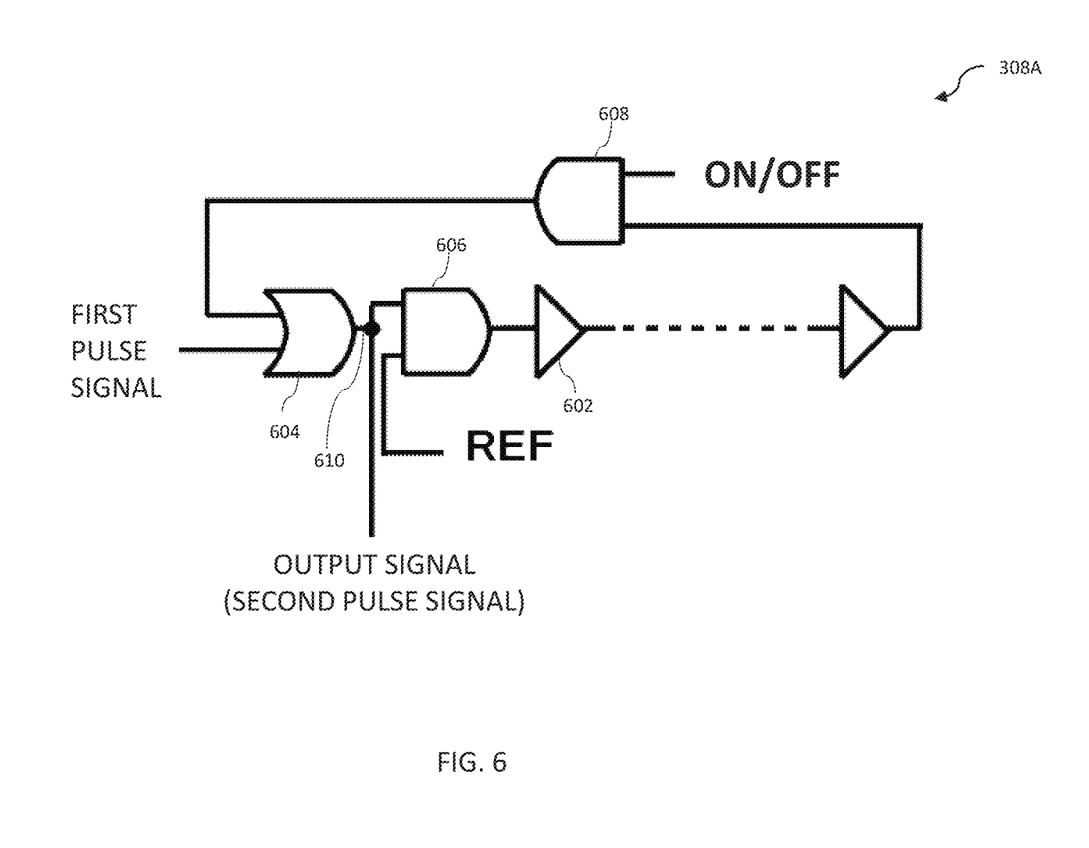
FIG. 6 is another schematic diagram of the pulse repeater circuit.

FIG. 6 is a schematic diagram of a pulse repeater circuit 308A, being an example implementation of the pulse repeater circuit 308.

The pulse repeater circuit 308A comprises a loop of delay elements as mentioned earlier, some of which are logic gates. Specifically, in the pulse repeater circuit 308A, the loop comprises one or more delay cells 602, OR gate 604 (which corresponds to the first logic gate discussed above), first AND gate 606 (which corresponds to the second logic gate discussed above) and second AND gate 608. Each of the logic gates illustrated in FIG. 6 may function as a delay element 502 either alone or in combination with other logic gates in the loop. Each delay cell 602 may be implemented, for example, as a pair of series-connected inverters.

Operation of the pulse repeater circuit 308A will now be described. In the following description, references to a "high" signal are taken to mean a signal interpreted as logic high by a logic gate (e.g. VDD or close to VDD). References to a "low" signal are taken to mean a signal interpreted as logic low by a logic gate (e.g. 0V or close to 0V).

The OR gate 604 is configured to receive the first pulse signal as a first input signal and a second pulse signal as a second input signal. The first pulse signal may comprise one or more first pulses and the second pulse signal may comprise a single second pulse or a succession of second pulses, as discussed above. When the first pulse signal or the second pulse signal is high (or both), the OR gate 604 generates a high output which is received as a first input at the first AND gate 606. The high output from the OR gate 604 remains high until the first pulse signal becomes low, the second pulse signal becomes low or both the first and second pulse signals become low.

The first AND gate 606 is further configured to receive the reset signal (REF) as a second input. When the reset signal and the high output received from the OR gate 604 are both high, the first AND gate 606 generates a high output which is fed back to the OR gate 604, via the one or more delay cells 602 and the second AND gate 608, as the second pulse signal. When either the reset signal or the high output received from the OR gate 604 is low, the first AND gate 606 generates a low output which is fed back to the OR gate 604. The pulse repeater circuit 308 is therefore configured to continue generating second pulses of the second pulse signal for a defined period of time until the reset signal becomes low. The reset signal may be the reference signal REF (as indicated) used in part to generate the first pulse signal, as illustrated in FIG. 6. Advantageously, the first AND gate 606 provides a means for avoiding race condition between clock cycles (i.e. between cycles of the reference signal REF).

The second AND gate 608 is configured to receive the second pulse signal as a first input and an ON/OFF (or enable) signal as a second input. When the on/off signal is high (indicating ON), the second AND gate 608 generates a high signal which corresponds to the second pulse signal. When the ON/OFF signal is low (indicating OFF), the second AND gate 608 generates a low signal thereby eliminating the repeating of second pulses in the second pulse signal. Advantageously, the second AND gate 608 functions as an ON/OFF switch which terminates the generation of second pulses when the ON/OFF signal is low, regardless of the state of any other signals received by the pulse repeater circuitry 308.

An output node 610 of the pulse repeater circuit 308, at which the pulse repeater output signal is generated, is connected to an output terminal of the OR gate 604. The pulse repeater output signal therefore comprises the second pulse signal. The delay between each second pulse of the second pulse signal and its preceding pulse is controlled by delay elements (the delay cells and the logic gates) connected into the loop.

With reference to the signals illustrated in FIG. 4, the overall gain of the pulse repeater output signal can be calculated according to the equations below (assuming that the reset signal is the reference signal REF and a reference clock signal of the phase detector is set to a 50% duty cycle):

$$A_{pulse\_rep} = \frac{T_{REF}}{2*(N_{del\_cell}*T_{del,del\_cell}+T_{del,OR}+2*T_{del,AND})}$$

(with second AND gate 608)

or $$A_{Pulse\_rep} = \frac{T_{REF}}{2*(N_{del\_cell}*T_{del,del\_cell}+T_{del,OR}+T_{del,AND})}$$

(without second AND gate 608)

where $T_{REF}$ is the time period of the reference signal, $N_{del\_cell}$ is the number of delay cells connected in the loop, $T_{del,del\_cell}$ is a delay introduced by each delay cell, $T_{del,OR}$ is a delay introduced by the OR gate 604, $T_{del,AND}$ is a delay introduced by the first and/or the second AND gate(s).

In embodiments where the reference signal REF frequency is 100 MHz and the second pulse signal comprises a succession of second pulses at a frequency of 2 GHz, the reduction in noise due to the pulse repeater circuit 308 can be calculated as follows:

$$20*\log(A_{pulse\_rep}) = 20*\log\left(\frac{2000}{2*100}\right) = 20dB$$

Advantageously, this reduction in noise due to the pulse repeater circuit 308 results in a dramatic improvement in overall PLL circuitry 300 noise performance. This improvement is particularly noticeable when using a reference signal with a relatively low frequency, in which case the noise due to the charge pump circuitry 312 dominates the PLL circuitry 300 noise performance.

Potential control of the delay between pulses, for example the delay caused by the loop of FIG. 6, will now be described in more detail with reference to FIG. 7.

Figure 7:
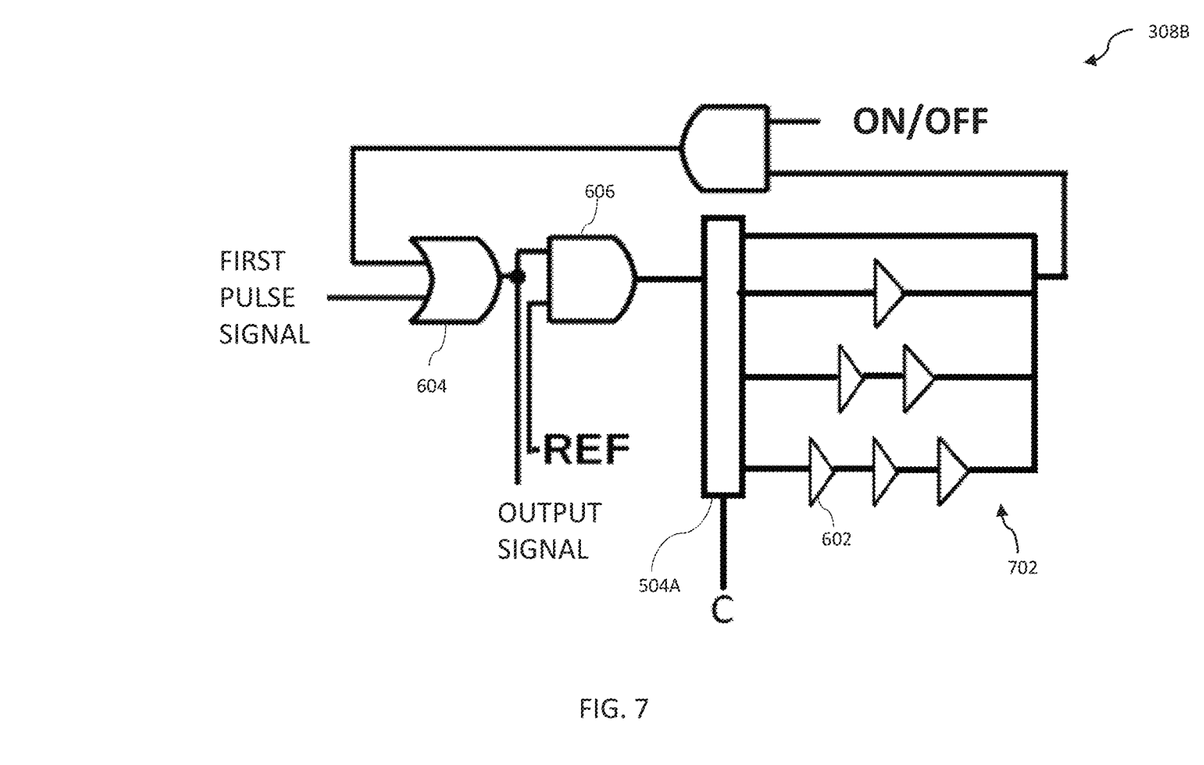
FIG. 7 is another schematic diagram of the pulse repeater circuit.

FIG. 7 is a schematic diagram of a pulse repeater circuit 308B, being an example implementation of the pulse repeater circuit 308A showing an example implementation of the control circuitry 504. Pulse repeater circuit 308B is similar to pulse repeater circuit 308A, and as such like elements are denoted with like reference signs and duplicate description is omitted.

The pulse repeater circuit 308B comprises control circuitry 504A, being an implementation of control circuitry 504, and an arrangement 702 of delay cells 602. The arrangement of inverters 702 comprises four different connection paths between the first AND gate 606 output and the first input of the OR gate 604, each of which can be individually connected into the loop. The first connection path includes no delay cells 602, the second connection path includes one delay cell 602, the third connection path includes two delay cells 602 and the fourth connection path includes three delay cells 602. Therefore, the delay increases from a minimum delay provided by the first connection path to a maximum delay provided by the fourth connection path. Of course, the number of connection paths, and the number of delay cells 602 per path, may vary from arrangement to arrangement.

The arrangement 702 of delay cells 602 may be controlled by the control circuitry 504A, based on control signal C, to vary the delay by selecting one of the four connection paths. For example, the control signal C may control the control circuitry 504A to connect the fourth connection path into the loop to provide the maximum delay.

Figure 8:
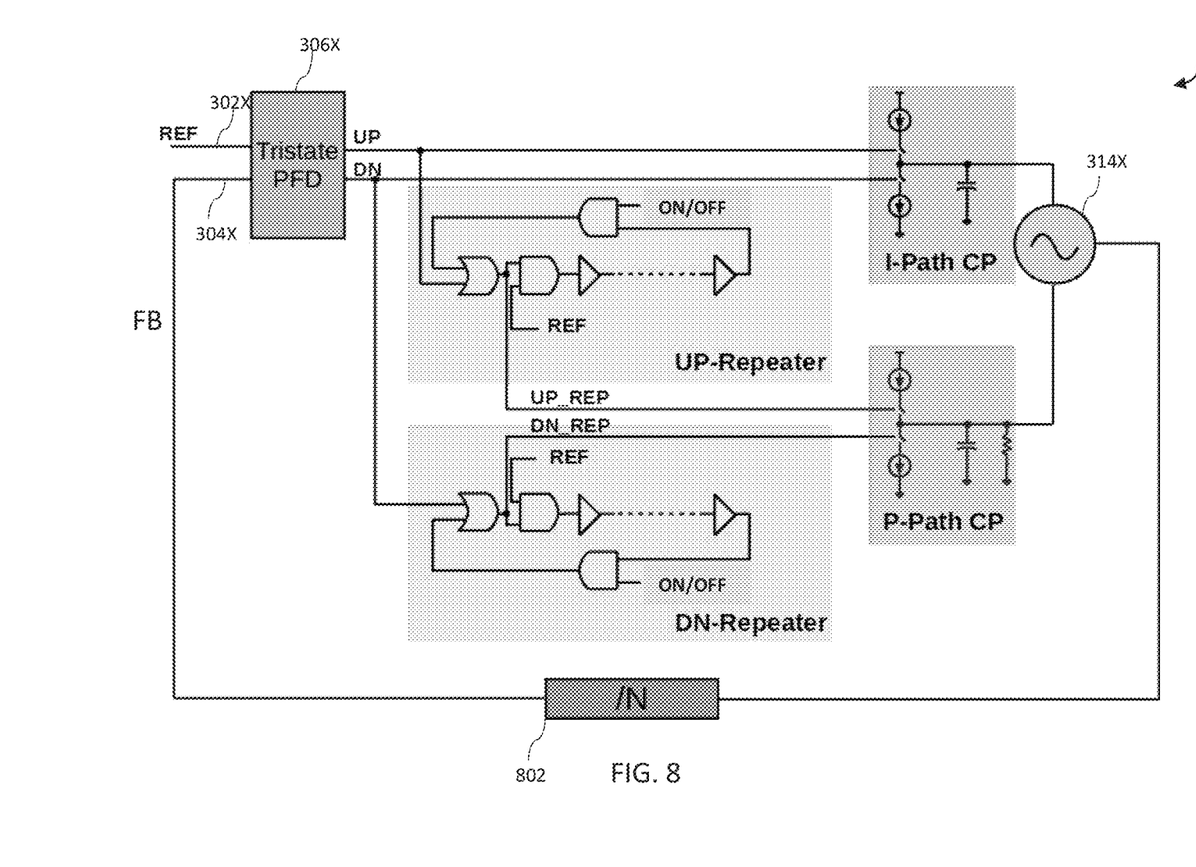
FIG. 8 is a schematic diagram of PLL circuitry comprising the pulse repeater circuitry of FIG. 6.

A current-steering charge pump phase locked loop, CP-PLL, 800 with dual-path VCO tuning incorporating the pulse repeater circuit 308 will now be described with reference to FIG. 8.

The basic configuration and operation of the CP-PLL 800 is the same as that of PLL circuitry 300 described above with reference to FIG. 3 and like elements are denoted with like reference signs. Therefore, a description of the basic configuration and operation of the CP-PLL 800 will be omitted for brevity.

The CP-PLL 800 differs from PLL 300 in that it comprises a pair of pulse repeater circuits (UP-Repeater and DN-Repeater) each configured to generate second pulse signals corresponding respectively to a pair of first pulse signals (UP and DN) generated by the phase detector 306X.

The CP-PLL 800 further differs from PLL 300 in that is comprises first and second control paths (I-Path and P-Path). The first control path is an integral control path (I-Path) connected between the phase detector 306X and an integral path charge pump (I-Path CP). The second control path is a proportional control path (P-Path) connected between the phase detector 306X and a proportional charge pump (P-Path CP).

The pair of pulse repeater circuits are connected along the second control path (P-Path) such that the UP-Repeater pulse repeater circuit generates a second pulse signal corresponding to the UP pulse signal, and the DN-Repeater pulse repeater circuit generates a second pulse signal corresponding to the DN pulse signal.

The integral charge pump and the proportional charge pump are both connected to the VCO 314X and are configured to generate control signals for controlling the VCO based on the second pulse signals generated by the pair of pulse repeater circuits. The VCO 314X is configured to control the frequency of the feedback signal based on the control signals.

The CP-PLL 800 may further comprise a frequency divider 802 connected between an output of the VCO and the second input terminal 304X of the phase detector 306X, the frequency divider being configured to divide the frequency of the feedback signal by a factor or N, where N is a positive integer.

Figure 9:
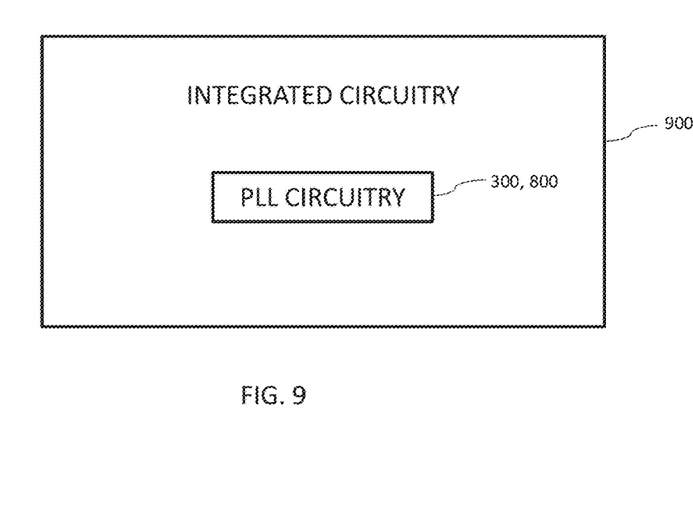
FIG. 9 is a schematic diagram of integrated circuitry incorporating the PLL circuitry embodying the present invention.
Figure 10:
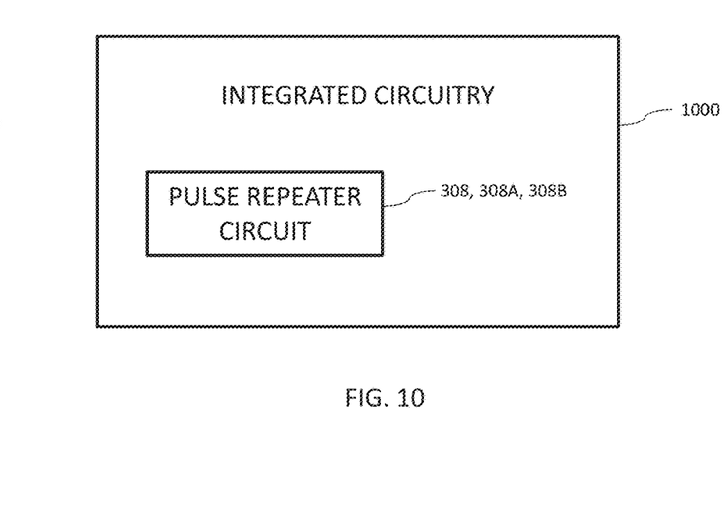
FIG. 10 is a schematic diagram of integrated circuitry incorporating the pulse repeater circuit embodying the present invention.

It will be appreciated that PLL circuitry 300, 800 embodying the present invention, or any of the pulse repeater circuits 308, 308A, 308B, may be implemented as integrated circuitry, for example on an IC chip such as flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards. FIG. 9 illustrates PLL circuitry 300, 800 implemented as integrated circuitry 900. FIG. 10 illustrates the pulse repeater circuit 308, 308A, 308B implemented as integrated circuitry 1000.

The present invention may be embodied in many different ways in the light of the above disclosure, within the spirit and scope of the appended claims.

The invention claimed is:

1. Phase Locked Loop, PLL, circuitry comprising:
a phase detector configured to generate a first pulse signal comprising at least one first pulse, a property of each first pulse being indicative of a phase difference between a reference signal and a feedback signal;
a pulse repeater circuit configured, based on the first pulse signal, to generate a second pulse signal comprising, for each first pulse, a second pulse generated by repeating the corresponding first pulse; and
an oscillator configured to generate the feedback signal and control a frequency of the feedback signal based on the second pulse signal,
wherein the pulse repeater circuit is configured such that, for each first pulse, the second pulse signal comprises a succession of second pulses, each successive second pulse of that succession of second pulses generated by repeating the corresponding first pulse or by repeating the or a preceding second pulse of that succession of second pulses,
and wherein, for each first pulse, the succession of second pulses is generated by performing said repeating until a corresponding period of time defined by the reference signal elapses.

2. The PLL circuitry according to claim 1, wherein each defined period of time is defined by the reference signal and the corresponding first pulse.

3. The PLL circuitry according to claim 1, wherein the pulse repeater circuit is configured, for each first pulse, to include that first pulse in the second pulse signal.

4. The PLL circuitry according to claim 1, wherein the pulse repeater circuit is configured to control a delay between each second pulse and the preceding pulse it repeats.

5. The PLL circuitry according to claim 1, wherein:
the pulse repeater circuit comprises one or more delay elements, optionally connected together to form a loop, a node along that loop being an output node at which the second pulse signal is generated, optionally wherein said delay is defined by said one or more delay elements.

6. The PLL circuitry according to claim 5, wherein:

the pulse repeater circuit is configured, based on a control signal, to control said delay by controlling a configuration of the pulse repeater circuit; and controlling the configuration of the pulse repeater circuit comprises controlling one or more of:

the number of delay elements connected to generate each second pulse, or the number of delay elements connected into the loop;

which delay elements are connected to generate each second pulse, or which delay elements are connected into the loop; and a configuration of at least one delay element which is connected to generate each second pulse, or a configuration of at least one delay element which is connected into the loop.

7. The PLL circuitry according to claim 6, wherein the pulse repeater circuit comprises control circuitry configured, based on the control signal, to control the configuration of the pulse repeater circuit.

8. The PLL circuitry according to claim 6, comprising control-signal generation circuitry configured to generate said control signal in dependence upon one or more of:

said reference signal; and another control signal received from external circuitry.

9. The PLL circuitry according to claim 5, wherein at least one said delay element connected into the loop is a logic gate having a first input forming part of the loop and a second input connected to receive the first pulse signal.

10. The PLL circuitry according to claim 5, wherein:

at least one said delay element connected into the loop is a logic gate having a first input forming part of the loop and a second input connected to receive a reset signal; and that logic gate is configured, for each first pulse, to terminate generation of the at least one repeated pulse in dependence upon the reset signal, optionally wherein the reset signal is, or is dependent upon, the reference signal.

11. The PLL circuitry according to claim 1, wherein:

the phase detector is configured to generate a pair of said first pulse signals;

the PLL circuitry comprises a pair of said pulse repeater circuits corresponding respectively to said first pulse signals and each configured to generate a said second pulse signal corresponding to its respective first pulse signal; and the oscillator is configured to control the frequency of the feedback signal based on the second pulse signals.

12. Integrated circuitry such as an IC chip comprising the PLL circuitry as claimed in claim 1.

* * * * *